(12) United States Patent
Weidinger et al.

(10) Patent No.: US 8,541,689 B2
(45) Date of Patent: Sep. 24, 2013

(54) METHOD FOR REMOVING A PART OF A PLANAR MATERIAL LAYER AND MULTILAYER STRUCTURE

(75) Inventors: Gerald Weidinger, Vienna (AT); Markus Leitgeb, Trofaiach (AT); Johannes Stahr, Bruck (AT); Günther Weichslberger, Graz (AT); Andreas Zluc, Leoben (AT)

(73) Assignee: AT & S Austria Technologie & Systemtecknik Aktiengesellschaft, Leoben-Hinterberg (AT)

( * ) Notice: Subject to any disclaimer, the term of this patent is extended or adjusted under 35 U.S.C. 154(b) by 910 days.

(21) Appl. No.: 12/449,611

(22) PCT Filed: Jan. 30, 2008

(86) PCT No.: PCT/AT2008/000027
§ 371 (c)(1),
(2), (4) Date: Aug. 17, 2009

(87) PCT Pub. No.: WO2008/098269
PCT Pub. Date: Aug. 21, 2008

(65) Prior Publication Data
US 2010/0059262 A1    Mar. 11, 2010

(30) Foreign Application Priority Data

Feb. 16, 2007   (AT) .............................. GM100/2007
Dec. 3, 2007    (AT) .............................. GM728/2007

(51) Int. Cl.
*H05K 1/00*    (2006.01)
*H05K 3/02*    (2006.01)

(52) U.S. Cl.
USPC .......................................... 174/258; 29/846

(58) Field of Classification Search
USPC ...................................................... 174/258
See application file for complete search history.

(56) References Cited

U.S. PATENT DOCUMENTS

| 5,144,534 | A | 9/1992 | Kober |
| 5,645,673 | A | 7/1997 | Fasano et al. |
| 6,245,382 | B1 | 6/2001 | Shvartsman |
| 6,293,008 | B1 * | 9/2001 | Schmidt et al. ................ 29/848 |
| 6,909,054 | B2 * | 6/2005 | Sakamoto et al. .......... 174/260 |

FOREIGN PATENT DOCUMENTS

| DE | 40 03 344 C1 | 6/1991 |
| DE | 202 21 189 U1 | 5/2005 |
| JP | 04-213888 | 8/1992 |

(Continued)

OTHER PUBLICATIONS

International Search Report Dated Jun. 25, 2008.

*Primary Examiner* — Gregory Thompson
(74) *Attorney, Agent, or Firm* — Jacobson Holman PLLC

(57) ABSTRACT

The invention relates to a method for removing a part of a substantially planar material layer (2) which is connected to at least one further, substantially planar material layer (9) in a connecting step. According to the invention, a zone where the material layers (2, 9) are not directly interconnected is provided in the zone where the part (11) is later on removed, said first zone being provided by applying a material (8) that prevents the material layers to be interconnected from sticking to each other. The invention also relates to a multilayer structure and to the use of the method and to a multilayer structure especially for producing a multilayer printed circuit board.

21 Claims, 4 Drawing Sheets

(56) References Cited

FOREIGN PATENT DOCUMENTS

| JP | 08-037378 | 2/1996 |
| JP | 08-037381 | 2/1996 |
| JP | 2003-264369 | 9/2003 |
| JP | 2006-173187 | 6/2006 |
| JP | 2006-237088 | 9/2006 |

* cited by examiner

METHOD FOR REMOVING A PART OF A PLANAR MATERIAL LAYER AND MULTILAYER STRUCTURE

This is a national stage of PCT/AT08/000,027 filed Jan. 30, 2008 and published in German, which has a priority of Austria no. GM100/2007 filed Feb. 16, 2007 and Austria no. GM 728/2007 filed Dec. 3, 2007, hereby incorporated by reference.

FIELD OF THE INVENTION

The present invention relates to a method for removing a subportion or part of a substantially flat or planar material layer which is bonded with at least one further substantially flat or planar material layer in a bonding procedure, wherein, in the region or zone of the subsequent removal of the subportion, an area kept free from direct bonding between the material layers is provided by applying a material preventing the adhesion of the material layers to be bonded and wherein the substantially flat material layers to be bonded are formed by layers of a multilayer printed circuit board, as well as a multi-layered or multilayer structure formed by at least two substantially flat or planar material layers to be bonded with each other, wherein, in the region of a subportion or part to be removed after having realized the bonding between the material layers, an area kept free from direct bonding between the material layers to be bonded is provided by the application of a material preventing the adherence of the material layers to be bonded and wherein the substantially flat material layers to be bonded are formed by layers of a multilayer printed circuit board. Moreover, the present invention relates to the use of such a method and such a multilayer structure, in particular, in the context of the production of a multilayer printed circuit board.

PRIOR ART

Such a method as well as such a multilayer structure as a multilayer printed circuit board is known, for example, from DE 40 03 344 C aiming at providing a simple method for the production of a rigid-flexible printed circuit board.

Moreover a method for the production of a protective film has become known, for example, from U.S. Pat. No. 6,245, 382 B, which film should adhere securely and reliably on a polymer substrate.

Although the subsequent description refers to the production of a multilayer printed circuit board, it should be noted that the method according to the invention as well as the multilayer structure according to the invention may be used in the most diverse applications, wherein it is aimed to remove a subportion from a substantially flat material layer after bonding with at least one further substantially flat material layer. In general, the present invention is applicable in connection with multilayer structures in which, after the production of a multilayer structure, a subportion is to be stripped, or one of the layers is to be removed. In this context, complex methods and constructions are, for instance, known, which, in particular, on account of the preconfectioning of at least one bonding layer used to bond the material layers to be bonded and the high operation expenditures involved as well as the accordingly high expenditures required for the subsequent proper orientation or registration of the material layers to be bonded, aim to strip or remove subportions from such material layers after bonding. The substantially flat material layers may, for instance, be comprised of paper-like or cardboard-like layers or elements to be bonded, substantially plate-shaped or sheet-shaped element such as, e.g., foils, sheets or metal plates or the like. In the context of bonding substantially flat or plate-shape materials, it is, for instance, known, in particular with a view to an optionally subsequently required removal of at least a subportion thereof, to accordingly preconfection foils having adhesive properties such that subportions of the foils which, during a bonding procedure, are to ensure the adhesion of the material layers to be bonded are provided with recesses. In addition to substantially continuous adhesive foils, preconfectioned separation foils may alternatively be used as a function of the subportion to be subsequently removed. It is immediately apparent that the preconfectioning of such bonding foils or adhesive foils and/or separation foils involves accordingly high expenditures and, in addition, makes accordingly high demands on the registration and orientation of the material layers to be bonded via the interposition of such, in particular preconfectioned, foils.

In the context of the production of multilayer electronic components and, in particular, multilayer printed circuit boards, the design of such electronic components, which has increased in complexity during the past years, has generally led to an increase in the number of bonding points between active components and components of a printed circuit board, wherein the increasing reduction of size has, at the same time, entrained a reduction of the distance between such bonding points. In the context of the production of printed circuit boards, the disentanglement of such component bonding points by microvias through several circuit board layers in so-called high density interbonds (HDI) has been proposed.

In addition to an increase in the complexity of the design and construction of printed circuit boards and the miniaturization involved, further requirements with a view to providing foldable or bendable bonds in a circuit board have come up, which have led to the development of a hybrid technology and the use of so-called rigid-flexible printed circuit boards. Such rigid-flexible printed circuit boards comprising rigid portions or subportions of the printed circuit board as well as flexible portions bonding such rigid portions, have enhanced reliability, offered other or additional options of freedom in terms of design and construction, and enabled further miniaturization.

For the production of such rigid-flexible printed circuit boards, bonding layers corresponding with the rigid and flexible portions of a circuit board and made of dielectric materials are to be provided between said portions, whereby the arrangement of appropriate sheet-shaped layers or films which, for instance by heat treatment, cause the bonding of circuit board rigid and flexible portions to be bonded will usually result in comparatively thick layers. Such thick layers not only counteract the intended miniaturization in the fabrication of multilayer circuit boards, but also entail losses of the registering accuracy required for subsequent laser borehole geometries for the formation of microvias and accordingly narrowly spaced-apart connection or bonding sites. Such thick, known layers of non-conductive material, or dielectric layers, moreover, involve additional processing or process steps and/or more complex designs for the production of the connections required between the rigid and flexible portions of circuit boards, since, in particular, the appropriate preconfectioning or formatting is to be performed as a function of the subsequent division of the rigid portions of the printed circuit board.

SUMMARY OF THE INVENTION

While avoiding the problems of the above-mentioned prior art regarding, in particular, the preconfectioning or formatting of bonding elements or foils, or separation foils, the present invention aims to further develop a method and multilayer structure of the initially defined kind to the effect that such multilayer structures can be produced by a simplified method, whereby, in particular complex preparation steps can be renounced or accordingly reduced.

To solve these objects, a method of the initially defined kind is substantially characterized in that, in the region of the subsequent removal of the subportion, a waxy paste is applied between the material layers to be bonded and that the wax of the adhesion-preventing material has a softening or melting point of at least 100° C. and, in particular, 120° C.

By providing according to the invention, in the region of the subsequent division or removal of a subportion, a bond-free area so as to prevent, in particular, the adherence of the subportion to be subsequently removed to the further material layer to be provided, a subsequent division of the material layer including the subportion or part to be removed can be reliably performed without observing extremely precise tolerances for the realization of the dividing step, for instance in respect to the division depth, for the subsequent removal of said subportion. By the provision of a bond-free or non-sticking area, it has, moreover, become possible to renounce, in particular, any preconfectioning and/or formatting of bonding-enabling layers in the region of the subsequent division and removal of the subportion such that preparation steps for the production or preparation of the material layers to be arranged and bonded, and of a layer to be used for bonding, will be facilitated. Due to the fact that the preconfectioning of an adhesive layer or bonding layer, or layer to be provided, can be renounced in the region of the subsequent division or removal of a subportion, it will, moreover, be feasible to even do with thin or thinner such intermediate layers or bonding layers of an adhesion-preventing material between the metal layers to be bonded. It is, thus, feasible according to the invention to use substantially continuous material layers, wherein the adhesion-preventing portion for the formation of the bond-free area can be applied or provided in a simple manner.

In the context of the production of a printed circuit board, a miniaturization of such a printed circuit board and, in particular, a rigid-flexible printed circuit board will, in particular, be feasible by minimizing the overall printed circuit board to be produced, whereby even problems as described above in the context of the known prior art in respect to the registering accuracy when providing thick layers when requiring the necessary preconfectioning or formatting of intermediate layers will be reliably avoided.

To form a portion to be kept free from bonding between the material layers to be bonded, which is provided in the region of the subportion to be subsequently removed, it is proposed according to the invention that, in the region of the subsequent removal of a subportion, a waxy paste is applied between the material layers to be bonded. Such a waxy paste can, in a simple and reliable manner and accordingly precisely as a function of the subsequent separation or removal of the subportion, be reliably and precisely applied on or to one of the material layers to be bonded so as to enable, at an accordingly simplified process control, after bonding of the material layers to be bonded, the simple removal of said subportion, since in the region of the subportion to be subsequently removed an accordingly unbonded area, or portion free of an adhering bond between the material layers, will be provided by the application of the adhesion-preventing material in the form of a waxy paste.

In order to obtain the desired separation effect by non-bonding through the application of the adhesion-preventing material, it is further proposed according to the invention that the wax of the adhesion-preventing material has a softening or melting point of at least 100° C. and, in particular, 120° C. Such a high softening or melting point of the wax of the layer of the adhesion-preventing material will, in the production of a printed circuit board, cause the additionally applied adhesive layers to cure during a lamination procedure and, at a further increase in temperature during the bonding or pressing cycle, the material or adhesion preventing material according to the invention to liquefy, thus safeguarding that the non-bond area provided by the adhesion-preventing material and required to enable the subsequent removal of the subportion will be reliably maintained. During the bonding procedure, the adhesion-preventing material, by the formation of a liquid layer in the subportion to be subsequently removed will prevent continuous bonding, for instance gluing together, of the material layers to be bonded.

For a particularly simple and position-precise application of the portion to be kept free from bonding with a view to the subsequent removal of a subportion of one of the material layers, it is proposed according to a further preferred embodiment that the adhesion-preventing material is applied by a printing process and, in particular, screen-printing, stencil-printing, offset printing, flexoprinting, tampon printing, ink-jet printing or the like, and optionally subjected to a subsequent drying and/or curing process.

For simple processing, such waxy pastes can, for instance, be applied in the form of micro-dispersions in polar or non-polar organic solvents.

For a particularly simple and reliable processing of the adhesion-preventing material, it is provided according to a further preferred embodiment that the adhesion-preventing material comprises a separation component, a binder and a solvent. The separation component ensures that an adhesion in the region of the subportion to be subsequently removed, between the material layers to be bonded will be reliably prevented. The binder, in particular, serves to fix the adhesion-preventing material to the support, or one of the material layers to be bonded, during the bonding procedure and adjust a rheology which will enable a perfect and problem-free application. Ethyl cellulose may, for instance, be used as a preferred binder. Moreover, such a binder will, for instance, migrate into the material of an adjoining flat material layer so as to further enhance the separation effect, or adherence-preventing action. The solvent, for instance, serves to enable the simple and reliable processing of the adhesion-preventing material.

In order to provide an accordingly easily and reliably usable and processable material preventing the adhesion of the material layers to be bonded, it is provided according to a further preferred embodiment that the adhesion-preventing material comprises a difference in polarity relative to the adjoining substantially flat material layers. The prevention of an adherence, or separation effect, is substantially based on the incompatibility, and difference in polarity, between the materials of the adjoining substantially flat material layers and the adhesion-preventing material. In this respect, a non-polar compound should possibly be used for the adhesion-preventing material, wherein, for instance, waxes of natural or synthetic origin are suitable for this.

In this context, it is proposed according to a further preferred embodiment that the adhesion-preventing material comprises hydrocarbon waxes and oils, waxes and oils based on polyethylene or polypropylene compounds, waxes and oils based on organic polyfluoro-compounds, esters of fatty acids and alcohols or polyamides, silicoorganic compounds and/or mixtures thereof. Such waxes and oils, as a function of the purpose of use, are available in large numbers in different configurations and with different chemical and physical properties so as to be selectable as a function of the material layers to be bonded. The hydrocarbon waxes and oils may be of synthetic or natural origin such as, e.g., paraffins. In addition to, in particular, synthetic waxes and oils based on polyethylene or polypropylene compounds, modifications of this product group may also be employed. As far as synthetic waxes and oils based on polyfluoro-organic compounds or organic polyfluoro-compounds are concerned, PTFE may be cited as an example. Waxes and oils based on esters of fatty acids, and mono- or polyvalent alcohols, may be of synthetic or natural origin such as, e.g., palmitic or stearic acid derivatives, carnauba wax or the like. Examples of silicoorganic compounds, for instance, include silicone and silicone oil.

In order to facilitate the application and handling, in particular, of the material layers to be bonded, it is, moreover, proposed that the adhesion-preventing material that the adhesion-preventing material is provided with inorganic and/or organic fillers and additives, as in correspondence with a further preferred embodiment.

By providing a comparatively high softening point for the adhesion-preventing material and providing the solvent having, for instance, a boiling point of less about 200° C., it will be ensured that no problems, for instance, in terms of premature drying will occur during the application of adhesion-preventing material. Such a boiling point will, moreover, ensure that the solvent will be substantially completely removed or evaporated at a further increase in temperature.

In order to obtain desiredly thin layer thicknesses while maintaining the bond-free area of the subportion to be removed, or preventing the adherence of the same, as provided by the invention, it is proposed according to a further preferred embodiment that the material-preventing material, in particular paste, is applied in a layer thickness of less than 25 μm and, in particular, less than 15 μm. Yet, layer thicknesses of up to 50 μm or, optionally, even more may also be envisaged.

In this context, it is, moreover, preferably proposed that the material layers to be bonded are bonded by a lamination process, whereby special requirements, particularly in connection with the production of a multilayer printed circuit board and the materials employed in the production of such a multilayer printed circuit board, can be taken into account due to the above-mentioned material properties of the adhesion-preventing material according to the invention, for instance in terms of the softening point of the wax of the adhesion-preventing material as well as the boiling point of the solvent contained in said material.

For a particularly reliable and simple removal or separation of the subportion to be removed after having bonded the flat material layers to be bonded, it is, moreover, proposed that edge regions of the subportion to be removed are defined and/or removed by milling, scratching, cutting, in particular laser-cutting, as in correspondence with a further preferred embodiment of the method according to the invention. Such milling, scratching, cutting or the like procedures can be accordingly precisely and reliably performed in conformation with the flat materials to be bonded, wherein even with the use of materials having slight thicknesses such as, for instance, in the context of the production of a multilayer printed circuit board, an accordingly precise and reliable performance of the dividing procedure will be feasible. As already pointed out above, the requirements in terms of tolerances to be observed, will, moreover, be accordingly reduced by the adhesion-preventing material layer.

To solve the above-mentioned objects, a multilayer structure of the initially defined kind is, moreover, essentially characterized in that, the adhesion-preventing material is comprised of a wax paste and that the wax of the adhesion-preventing material has a softening or melting point of at least 100° C. and, in particular, 120° C.

It is, thus, readily feasible to provide a bond between at least two substantially flat or planar material layers of a multilayer printed circuit board, with the subsequent removal of a subportion to be removed being enabled by the provision and simple application of an adhesion-preventing material or adhesion-preventing material. In addition, an enhanced orientation or registration of the substantially flat material layers to be bonded will be ensured.

For the simple formation of the bond-free area in the region of the subportion to be subsequently removed, of the substantially flat material layers to be bonded, it is proposed according to the invention that the adhesion-preventing material is comprised of a wax paste.

To produce the multilayer structure according to the invention, in which a subportion is to be subsequently removed, it is, moreover, preferably proposed that the adhesion-preventing material comprises hydrocarbon waxes and oils, waxes and oils based on polyethylene or polypropylene compounds, waxes and oils based on organic polyfluoro-compounds, esters of fatty acids and alcohols or polyamides, silicoorganic compounds and/or mixtures thereof. According to a particularly preferred embodiment, it is, moreover, proposed that the adhesion-preventing material is provided with inorganic and/or organic fillers and additives.

In order to achieve accordingly thin overall thicknesses of the multilayer structure according to the invention, it is, moreover, proposed that the adhesion-preventing material is applied in a layer thickness of less than 25 μm and, in particular, less than 15 μm, as in correspondence with a further preferred embodiment of the multilayer structure according to the invention.

A particularly reliable bond will be provided in that the material layers to be bonded are bonded by a lamination process.

The reliable removal of the subportion to be removed after bonding of the substantially flat material layers to be bonded will, moreover, be achieved in that edge regions of the subportion to be removed are definable and/or removable by milling, scratching, cutting, in particular laser-cutting, as in correspondence with a further preferred embodiment of the multilayer structure according to the invention.

As already pointed out several times, it is, moreover, proposed according to the invention that the method according to the invention or a preferred embodiment of the same and/or the multilayer structure according to the invention or a preferred embodiment of the same are used for the production of a multilayer printed circuit board.

In particular, in the context of such a use according to the invention, it is, moreover, proposed in a preferred manner to use the method according to the invention, or the multilayer structure according to the invention, for the production of cavities, in particular three-dimensional cavities, in a printed circuit board.

Further preferred uses of the method according to the invention and/or the multilayer structure according to the invention include the production of at least one channel in a printed circuit board, a bond-free area for the production of cavities, in particular three-dimensional cavities, in a printed circuit board, the production of offset and/or stepped subportions of a printed circuit board, the non-bonding of at least one element, in particular registering element, in the interior or within inner layers of a multilayer printed circuit board, and/or the production of a rigid-flexible printed circuit board.

SHORT DESCRIPTION OF THE DRAWINGS

In the following, the invention will be explained in more detail by way of exemplary embodiments schematically illustrated in the accompanying drawing, of the method according to the invention for producing a multilayer structure according to the invention.

Therein:

FIG. 1 is a schematic section through a first embodiment of a flat material layer of a multilayer structure to be produced according to the invention, in the form of a rigid portion of a rigid-flexible printed circuit board as a multilayer structure according to the invention;

FIG. 2, in an illustration similar to that of FIG. 1, illustrates a section through the rigid portion of a rigid-flexible printed circuit board, wherein milling edges are provided in the region of a subsequent division of the rigid portion subportion to be removed;

FIG. 3, in an illustration similar to those of FIGS. 1 and 2, depicts a section through the rigid portion of a rigid-flexible printed circuit board, wherein an adhesion-preventing material is provided or applied in the region of the subsequent division as well as the milling edges, for the formation of a bond-free area to prevent direct bonding between the substantially flat material layers formed by the rigid portion and the flexible portion of the printed circuit board;

FIG. 4 illustrates another section again similar to those of the preceding Figures, wherein a layer of non-conductive or dielectric material and a flexible portion of the rigid-flexible printed circuit board as a second substantially flat material layer are arranged on, or fixed to, the rigid portion of the first material layer;

FIG. 5 in a further similar section depicts the multilayer structure according to the invention in the form of a rigid-flexible printed circuit board after the division of the rigid portion;

Figure 7:
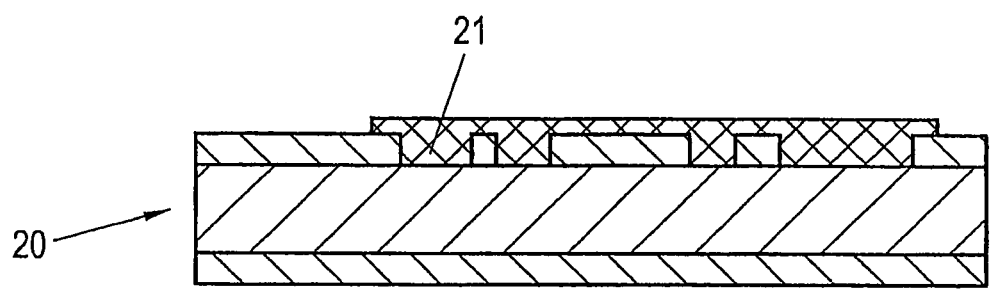
FIG. 7 depicts a schematic section through the flat material layer illustrated in FIG. 6, with a layer of an adhesion-preventing material being applied.
Figure 8:
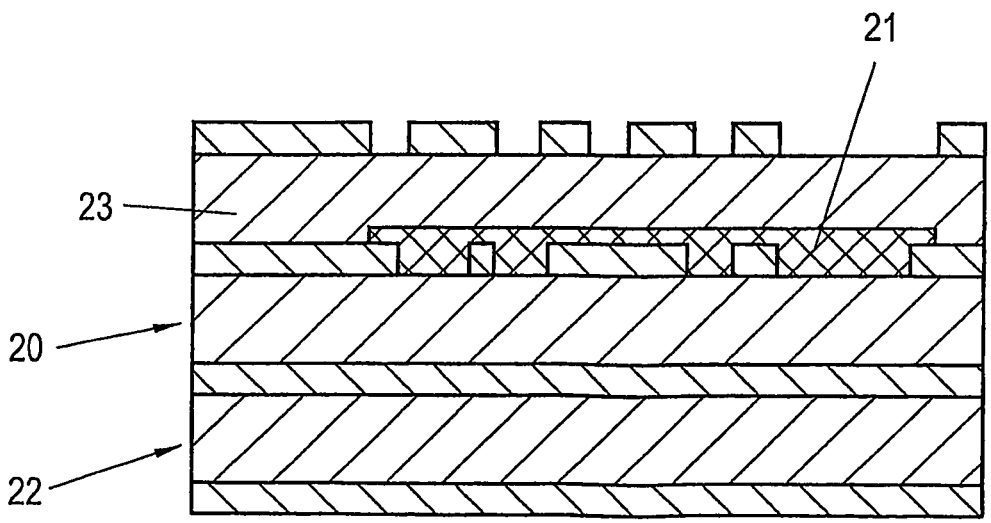
Figure 9:
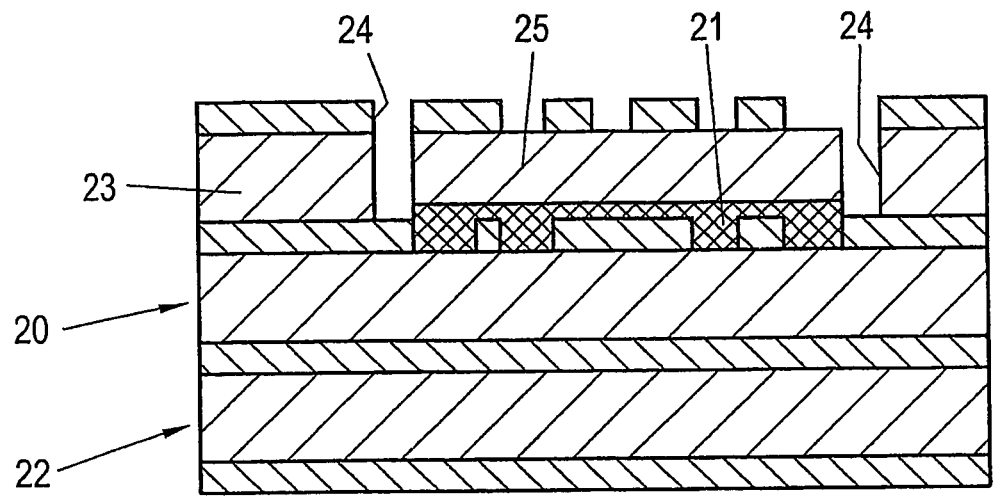
Figure 10:
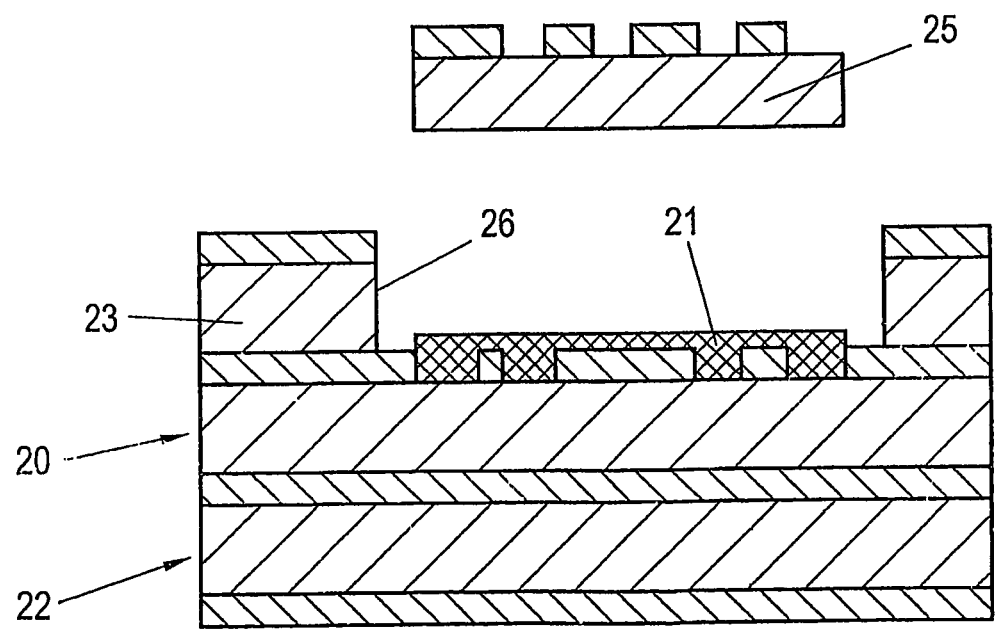

FIG. 8 depicts schematic section through the flat material layer illustrated in FIGS. 6 and 7, which is bonded with at least one further flat material layer to produce a multilayer printed circuit board as a multilayer structure according to the invention, FIG. 9, in an illustration similar to that of FIG. 8, depicts a schematic section through the subportion of the multilayer structure to be subsequently removed, which is delimited or defined by cutting; and FIG. 10 is an illustration similar to that of FIG. 9, with the cut or delimited subportion being removed.

DETAILED DESCRIPTION OF PREFERRED EMBODIMENTS

A first embodiment of a multilayer structure according to the invention, which is produced as a rigid-flexible printed circuit board using the method according to the invention, is described with reference to FIGS. 1 to 5.

Figure 1:
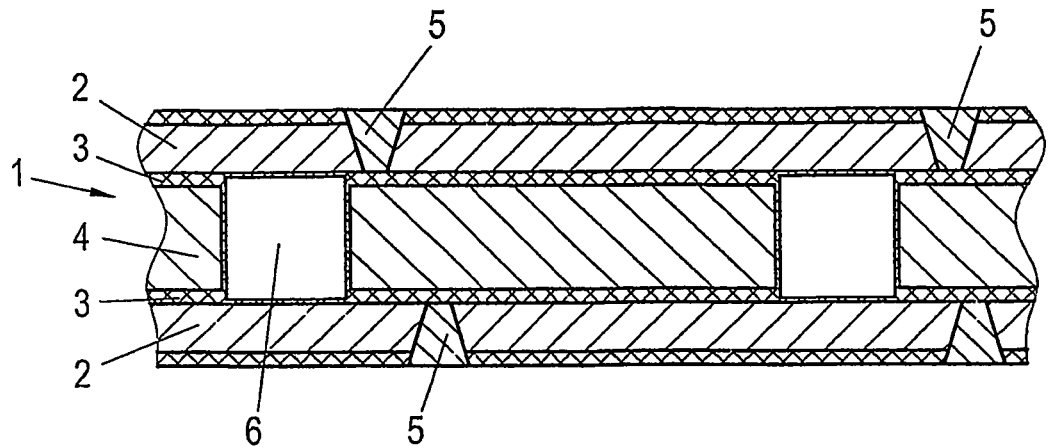

FIG. 1 is a schematic illustration of a rigid, multilayer portion 1 as a first substantially flat or planar material layer of a rigid-flexible printed circuit board to be subsequently produced as a multilayer structure. Individual metal or copper layers 2 are, for instance, separated by prepreg layers 3 and a core 4. Connections between the individual copper layers 2 are indicated via microvias 5 and passages 6, respectively.

Figure 2:
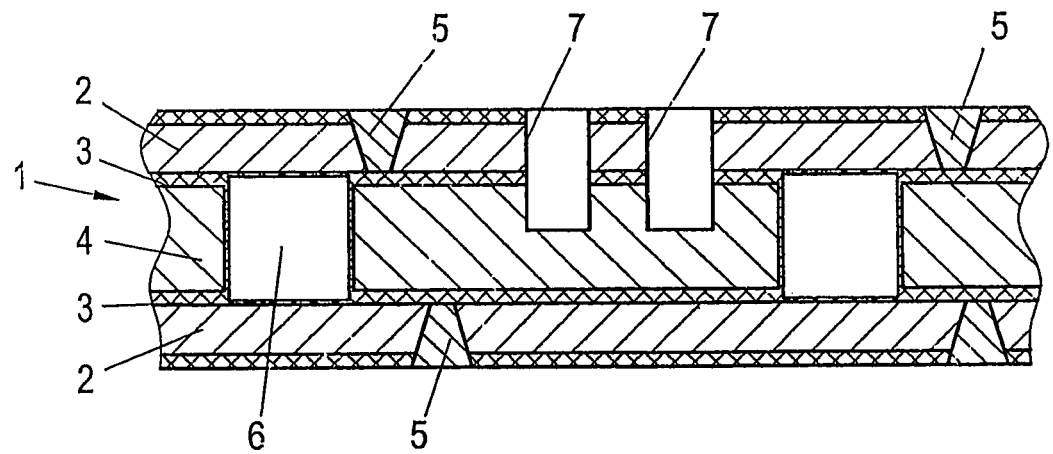
Figure 3:
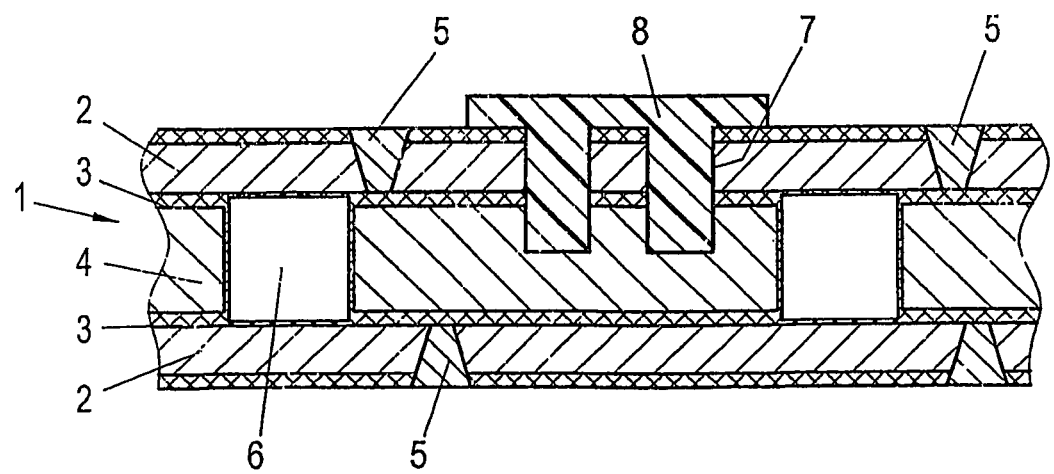

For the production of a rigid-flexible printed circuit board, milling edges 7 are formed in the region of a subsequent division of the rigid multilayer portion 1 of the rigid-flexible printed circuit board to be produced, as indicated in FIG. 2.

In order to provide a bond-free area, or prevent direct bonding between the printed circuit board rigid portion 1 to be subsequently divided and a layer of non-conductive or dielectric material to be provided and arranged as a second substantially flat material layer of the printed circuit board for bonding with a flexible portion, a material 8 preventing such an adhesion or sticking is provided following the formation of the milling edges 7, in the region of the subsequent division and in the channels or grooves formed by the milling edges 7 in the embodiment depicted in FIGS. 1 to 5. The adhesion-preventing material may, for instance, be comprised of a waxy paste 8, such a waxy paste 8 being applied, or introduced, in the region of the subsequent division as well as into the milling edges 7 by simple method steps, e.g. by a printing process, in particular screen-printing or stencil-printing. Depending on the material 8 used, or the waxy paste, a drying and/or curing process may be provided following the application of the material or paste 8.

The material or paste 8 can be applied in the form of a micro-dispersion in polar or nonpolar organic solvents. For the simple processability and for simple handling, it is, moreover, provided that the paste 8 is, for instance, comprised of polyethylene waxes, polypropylene waxes, Teflon-based waxes and/or mixtures thereof.

To further enhance the processability, it may, moreover, be contemplated that the paste 8 is provided with inorganic and/or organic fillers and/or additives.

In order to achieve accordingly thin layer thicknesses or overall thicknesses of the rigid-flexible printed circuit board to be produced, it is, moreover, provided that the paste or adhesion-preventing material 8 is applied in the region of the subsequent division in a layer thickness of less than 25 μm and, in particular, less than 20 μm.

While, in the embodiment represented in FIGS. 1 to 5, the formation of milling edges 7 is provided prior to the application of the adhesion-preventing material or paste 8, the paste 8 may alternatively be applied in the region of the subsequent division of the rigid and, in particular, multilayer portion of the printed circuit board, after which the milling edges 7 will subsequently pass through the applied material 8.

Figure 4:
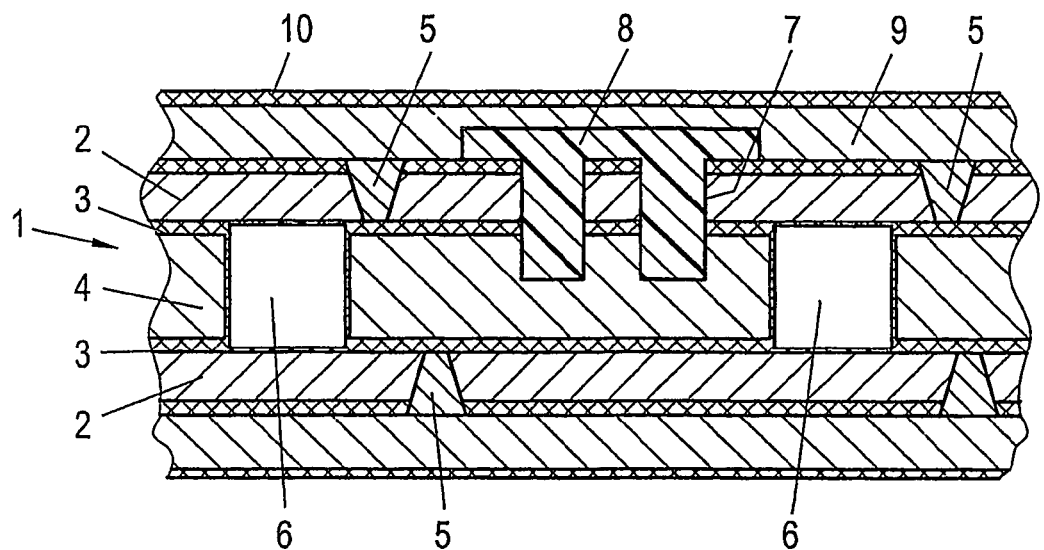

As depicted in FIG. 4, the application of the adhesion-preventing material or waxy paste 8 in the region of the subsequent division as well as the milling edges 7 is followed by the application or arrangement of a bonding layer 9 of non-conductive or dielectric material, said bonding layer 9 being, for instance, comprised of a foil known per se, for instance a prepreg or RCC foil, or even a liquid dielectric material. Following the layer 9 of non-conductive or dielectric material, a flexible subportion 10 of the rigid-flexible printed circuit board to be produced is indicated, wherein the flexible portion 10 of the rigid-flexible printed circuit board to be produced, like the rigid portion 1, may be comprised of several layers.

By the arrangement of the adhesion-preventing material 8 or waxy paste, preconfectioning and/or formatting for the non-conductive or dielectric material layer 9 to be provided can be renounced, in particular, in the region of the subsequent division in the region of the milling edges 7 such that preparation steps for the non-conductive or dielectric material layer 9 to be provided will be simplified or reduced.

By providing the bond-free area in the region or zone of the application of the material 8 on the rigid portion 1 of the rigid-flexible printed circuit board to be produced, thinner layer thicknesses of the layer 9 will, moreover, do, said thickness being, for instance, selected to be less than 50 μm and, in particular, 40 μm or less. The provision of such thin layer thicknesses of the layer of non-conductive material to be arranged between the rigid portion 1 and the flexible portion 10 of the rigid-flexible printed circuit board to be produced will not only promote a reduction of the overall thickness of the rigid-flexible printed circuit board to be produced, but the positioning and registering accuracy of the portions to be bonded and of subsequent passages or microvias will also be enhanced.

Figure 5:
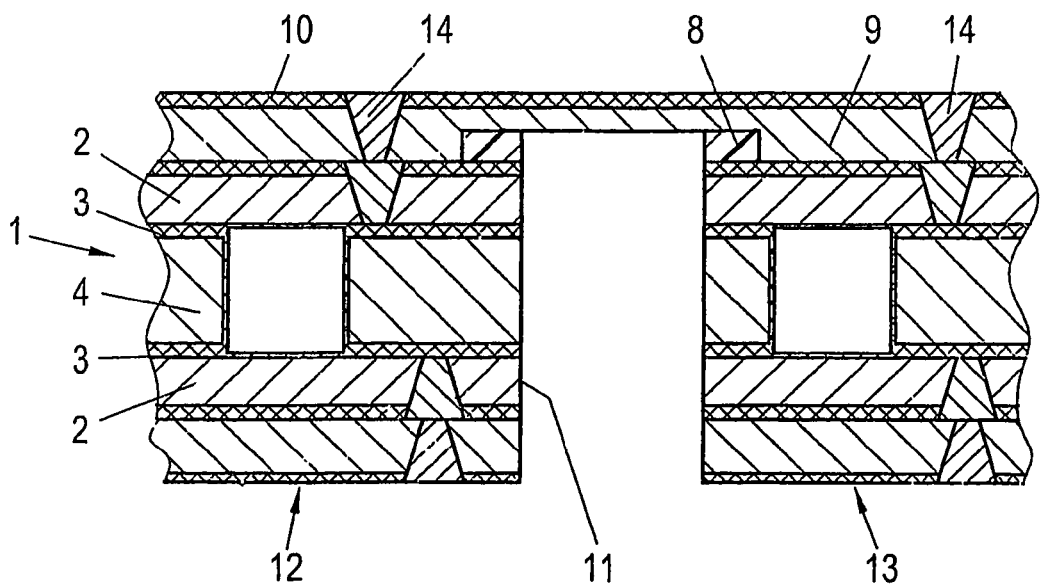

FIG. 5 represents a section through the rigid-flexible printed circuit board formed by the rigid portion 1 and the flexible portion 10 as a multilayer structure, wherein a division 11 has been made between the then separated rigid subportions 12 and 13 in the region of the milling edges 7. Said division 11 constitutes a subportion to be subsequently removed after bonding of the flat material layers. It is, moreover, indicated that a connection between the flexible portion 10 of the printed circuit board and the then separated rigid subportions 12 and 13 is achievable by additional microvias or passages 14.

As is further apparent from the illustration according to FIG. 5, it is possible, without having to consider or observe very precise tolerances in terms of the cutting depth of the division or subportion 11 to be removed, to facilitate also the production of the division and, hence, subsequent method steps by providing the non-bonding surface, or preventing bonding, through the application of the adhesion-preventing material 8.

By the appropriate choice of the adhesion-preventing material or waxy paste 8 and the layer 9 of non-conductive or dielectric material to be arranged between the rigid portion 1, or subsequently separated rigid portions 12 and 13, respectively, and the flexible portion 10 of the printed circuit board, it will be readily feasible to take into account legal limitations required when using specific hazardous substances in electric and electronic equipment.

By providing the bond-free area through the application of an adhesion-preventing material or waxy paste 8, simple method steps will do, in particular, in the preparation or production of the layer 9 to be arranged between the flexible portion 10 and the rigid portion 1 as well as in subsequent method steps for realizing the division.

By using thin layer thicknesses for bonding the flexible portion 10 as well as the rigid portion 1, and the mutually separated rigid portions 12 and 13, respectively, and the thus achievable thin layer thickness as well as the hence resulting improvements in the registering accuracy, it has, moreover, become possible to provide printed circuit boards with flexible layers 10 for highly complex components even in large formats, for instance in the production format of HDI circuit boards of more than 18×24 inch.

The embodiment of a multilayer rigid printed circuit board, or rigid portion 1 of a printed circuit board, which is depicted in FIGS. 1 to 5, for illustration purposes merely represents a simplified example of such a multilayer printed circuit board as a multilayer structure, wherein also a larger number or plurality of, in particular, conductive layers 2 and feedthroughs via microvias 5 or passages 6 and 14, respectively, may be employed as a function of the desired complexity of the component to be produced.

Figure 6:
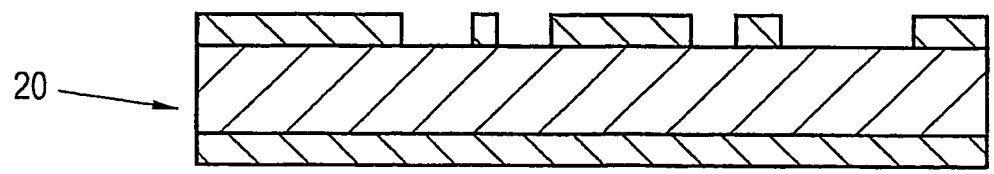
FIG. 6 is a schematic section through a modified embodiment of a substantially flat material layer of a printed circuit board as a multilayer structure according to the invention to be produced by the method of the invention.

In the exemplary embodiment illustrated in FIGS. 6 to 10, of a modified multilayer structure, again in the form of a multilayer printed circuit board to be produced, a structured core of such a printed circuit board is generally denoted by 20, which core 20 comprises several layers with, in particular, the upper layer depicted in FIG. 6 being structured accordingly.

The core 20, which is comprised of one or several layer(s) and constitutes a substantially flat material layer, in a subportion is subsequently provided with an adhesion-preventing material or adhesion-preventing material 21 for bonding with further layers as additional substantially flat material layers, as illustrated in FIG. 7, said adhesion-preventing material being, for instance, applied by screen-printing.

Following the application of the adhesion-preventing material 21 on the substantially flat material layer formed by the core 20 as illustrated in FIG. 7, bonding in a manner known per se, for instance by a lamination process, of the flat core 20 with a plurality of again substantially flat material layers 22 and 23 is effected, the subportion provided with the adhesion-preventing material being again denoted by 21 in FIG. 8. The flat material layer 23 illustrated in FIG. 8 may again be accordingly structured on its upper surface.

After the bonding procedure illustrated in FIG. 8, between the plurality of substantially flat material layers 20, 22 and 23, a delimitation or definition of a subportion 25 of the substantially flat material layer 23 is effected, for instance, by cutting, in particular laser cutting, while forming cutting lines or impressions 24, as is apparent from FIG. 9. The adhesion-preventing material 21 provided below the subportion 25 to be removed renders feasible in a simple manner, after the formation of the cutting line or delimiting impressions 24, the simple and reliable removal of the subportion 25, as is illustrated or indicated in FIG. 10.

In the embodiment depicted in FIGS. 6 to 10, additional layers are indicated between the individual substantially flat material layers, which additional layers are known as such in the context of the fabrication of a multilayer printed circuit board and, therefore, not discussed in detail.

Also from the embodiment according to FIGS. 6 to 10, it is clearly apparent that the bond-free area provided in the context of bonding substantially flat materials or material layers 20, 22 and 23 by applying an adhesion-preventing material 21 comprised, for instance, of a wax paste will subsequently allow for the simple and reliable removal of subportions 25 of at least one substantially flat layer 23 to be bonded therewith.

The cutting and, for instance, laser cutting operation illustrated and discussed in FIG. 9 may, for instance, be replaced with a milling operation as described in the embodiment according to FIGS. 1 to 5, or by scratching or a similar dividing operation of the at least one material layer 23.

From the embodiment according to FIGS. 6 to 10, it is apparent that a cavity 26 and, in particular, three-dimensional cavity can, for instance, be created in subportions or individual layers of a multilayer printed circuit board by removing a subportion 25.

It is, moreover, possible to use such a cavity 26 formed by the removal of the subportion or element 25 for the subsequent arrangement of separated elements in interior regions or inner layers of a multilayer printed circuit board.

In addition, the removal of subportions allows for the fabrication of a printed circuit board with offset and/or stepped subportions for special applications.

The adhesion-preventing material 8 and 21, respectively, besides the materials mentioned in the above-described embodiments, may, for instance, also comprise hydrocarbon waxes and oils, waxes and oils based on polyethylene or polypropylene compounds, waxes and oils based on organic polyfluoro compounds, esters of fatty acids and alcohols or polyamides, silicoorganic compounds and/or mixtures thereof.

Instead of forming a multilayer structure of a multilayer printed circuit board, as disclosed in the above-described exemplary embodiments, such multilayer structures may also be formed by materials different from the materials used for the production of a printed circuit board, such as, e.g., foils or sheet- or plate-shaped materials. After or during the simple and reliable bonding of substantially flat material layers, wherein the preconfectioning or formatting of, for instance, adhesive or bonding foils is renounced for the bonding layer, it is possible, following such a simplified bonding of substantially continuous material layers, to simply and reliably remove subportions by providing or applying the adhesion-preventing material 8 or 21, respectively.

In addition to the printing methods, e.g. screen-printing, mentioned in the above exemplary embodiments for the application of the adhesion-preventing material 8 or 21, respectively, offset printing, flexoprinting, tampon printing, ink-jet printing or the like may be provided or used, in particular, as a function of the nature of the adhesion-preventing material.

For the reliable separation or removal of the portion 11 or 25, respectively, to be subsequently removed, it is to be taken care, in particular, when using the adhesion-preventing material 8 or 21, particularly in the form of a waxy paste, that this adhesion-preventing material exhibits an appropriate difference in polarity as well as an incompatibility with the adjoining substantially flat material layer(s).

In the context of the production of a printed circuit board, polarity differences and incompatibilities with epoxy resins, phenolic resins and copper as frequently used layers of a multilayer printed circuit board are, for instance, to be taken into account.

By the option provided by the invention, of a structured application of the adhesion-preventing material 8 or 21, subsequent methods steps, in particular in connection with the removal of subsequently removable subportions 11 or 25 of a multilayer structure, will be facilitated in a simple manner.

By using, for instance, an adhesion-preventing material layer 8 or 21 which is applicable by simple printing techniques, formatting and confectioning techniques as are provided in the prior art, for instance for separation foils, can be obviated.

When using a waxy paste for the adhesion-preventing material 8 or 21, it is, moreover, advantageous that residues of the adhesion-preventing material 8 or 21 optionally remaining after the removal of, for instance, subportion 11 or 25, can again be removed in a simple and reliable and, in particular, complete manner.

In particular, in the context of the production or processing of printed circuit boards, non-bonding or the provision of an adhesion-preventing material 8 or 21 will enable the formation of a space 26 for additional components, for instance by a local thickness reduction, as already mentioned above. Such a provision of a space 26, in particular and substantially in the interior of such a multilayer printed circuit board will, moreover, enable a reduction of the overall thickness of such a multilayer printed circuit board by the embedment of such components so as to take into account the requirements of a miniaturization of printed circuit boards.

By a local thickness reduction, it has, for instance, become possible to contact additional components to be arranged in the region of the removed subportion 25, in particular after the removal of the optionally remaining adhesion-preventing material 21, as indicated in FIG. 10, directly on the bottom of such a recess or cavity 26. In doing so, it is, for instance, possible in a simple manner to arrange the respective contact elements or conductive structures, in case of the material layer 20 provided in FIG. 6, in the region of the cavity 26 to be subsequently produced, as is illustrated in FIG. 10.

As already pointed out above, the subsequent removal of subportions 25 while forming cavities 26 will also render feasible the provision of accordingly three-dimensional open or optionally closed cavities, wherein it is feasible, for instance when departing from the condition represented in FIG. 10, to provide further layers of a multilayer printed circuit board.

By the appropriate choice or arrangement of the adhesion-preventing material 8 or 21, it is, moreover, possible to enable the formation of cavities 26 over several layers of such a multilayer conductor structure, as is, for instance, indicated in FIG. 5 with reference to the first embodiment.

In the context of the production of printed circuit boards, it is, thus, for instance, also possible, by removing subportions 25, to provide an accordingly simplified non-bonding of registering elements.

The formation of stepped or offset subportions, for instance, allows for the creation of interleaved or overlapping portions of a multilayer printed circuit board.

By the removal of subportions or parts through the application of an adhesion-preventing material 8 or 21 it will, moreover, for instance, be feasible to provide repair options of already existing or populated printed circuit boards with embedded components, if, for instance, an adhesion-preventing material is accordingly provided as a precaution in the region of components optionally subject to high failure or damage rates so as to enable the repair of a printed circuit board by the removal of a subportion in the event of a defect of such a component rather than requiring its complete substitution, thus enabling the simple exchange of components and the simple provision of a multilayer structure comprised of at least two substantially flat material layers to be bonded.

The invention claimed is:

1. A method for removing a subportion or part of a substantially flat or planar material layer which is bonded with at least one further substantially flat or planar material layer in a bonding procedure, wherein, in the region or zone of the subsequent removal of the subportion, an area kept free from direct bonding between the material layers is provided by applying an adhesion-preventing material preventing the adhesion of the material layers to be bonded and wherein the substantially flat material layers to be bonded are formed by layers of a multilayer printed circuit board, wherein, the adhesion-preventing material has a softening or melting point of at least 100° C. resulting in hardening of any further layers of adhesive being use and resulting in a liquefaction of the adhesion-preventing material during a further increase of the temperature during a connecting or pressing process, and wherein the adhesion-preventing material is applied as a waxy paste as a dispersion in a solvent and the adhesion-preventing material comprises a separating component and a binder.

2. The method according to claim 1, wherein the adhesion-preventing material is applied by a printing process selected from the group consisting of screen-printing, stencil-printing, offset printing, flexoprinting, tampon printing, and ink-jet printing and optionally subjected to a subsequent drying and/or curing process.

3. The method according to claim 1, wherein the adhesion-preventing material comprises a difference in polarity relative to the adjoining substantially flat material layers.

4. The method according to claim 1, wherein the adhesion-preventing material comprises hydrocarbon waxes and oils, waxes and oils based on polyethylene or polypropylene compounds, waxes and oils based on organic polyfluoro compounds, esters of fatty acids and alcohols or polyamides, silicoorganic compounds and/or mixtures thereof.

5. The method according to claim 1, wherein the adhesion-preventing material is provided with inorganic and/or organic fillers and additives.

6. The method according to claim 1, wherein the adhesion-preventing material is applied in a layer thickness of less than 25 μm.

7. The method according to claim 1, wherein the material layers to be bonded are bonded by a lamination process.

8. The method according to claim 1, wherein edge regions of the subportion to be removed are defined and/or removed by milling, scratching, or cutting.

9. The method according to claim 6, wherein the softening or melting point of the adhesion-preventing material is at least 120° C.

10. A multilayer structure formed by at least two substantially flat or planar material layers to be bonded with each other, wherein, in the region of a subportion or part to be removed after having realized the bonding between the material layers, an area kept free from direct bonding between the material layers to be bonded is provided by the application of a material preventing the adherence of the material layers to be bonded and wherein the substantially flat material layers to be bonded are formed by layers of a multilayer printed circuit board, wherein the adhesion-preventing material is comprised of a wax paste and that the wax of the adhesion-preventing material has a softening or melting point of at least 100° C. resulting in hardening of any further layers of adhesive being use and resulting in a liquefaction of the adhesion-preventing material during a further increase of the temperature during a connecting or pressing process, and wherein the adhesion-preventing material is applied as a waxy paste as a dispersion in a solvent and the adhesion-preventing material comprises a separating component and a binder.

11. The multilayer structure according to claim 10, wherein the adhesion-preventing material comprises hydrocarbon waxes and oils, waxes and oils based on polyethylene or polypropylene compounds, waxes and oils based on organic polyfluoro compounds, esters of fatty acids and alcohols or polyamides, silicoorganic compounds and/or mixtures thereof.

12. The multilayer structure according to claim 10, wherein the adhesion-preventing material is provided with inorganic and/or organic fillers and additives.

13. The multilayer structure according to claim 10, wherein the adhesion-preventing material is applied in a layer thickness of less than 25 μm.

14. The multilayer structure according to claim 10, wherein the material layers to be bonded are bonded by a lamination process.

15. The multilayer structure according to claim 10, wherein edge regions of the subportion to be removed are definable and/or removable by milling, scratching, or cutting.

16. A method for the production of a multilayer printed circuit board comprising the steps of removing a subportion or part of a substantially flat or planar material layer which is bonded with at least one further substantially flat or planar material layer in a bonding procedure, wherein, in the region or zone of the subsequent removal of the subportion, an area kept free from direct bonding between the material layers is provided by applying an adhesion-preventing material preventing the adhesion of the material layers to be bonded and wherein the substantially flat material layers to be bonded are formed by layers of the multilayer printed circuit board, wherein, the adhesion-preventing material has a softening or melting point of at least 100° C. resulting in hardening of any further layers of adhesive being use and resulting in a liquefaction of the adhesion-preventing material during a further increase of the temperature during a connecting or pressing process, and wherein the adhesion-preventing material is applied as a waxy paste as a dispersion in a solvent and the adhesion-preventing material comprises a separating component and a binder.

17. The method according to claim 16 for the production of cavities in the printed multilayer circuit board.

18. The method according to claim 16 for the production of at least one channel in the printed multilayer circuit board.

19. The method according to claim 16 for the non-bonding of at least one element in the interior or within internal layers of the multilayer printed circuit board.

20. The method according to claim 16 for the production of offset and/or stepped subportion of the printed multilayer circuit board.

21. The method use according to claim 16 for the production of the printed multilayer circuit board that is rigid-flexible.

* * * * *

UNITED STATES PATENT AND TRADEMARK OFFICE
CERTIFICATE OF CORRECTION

PATENT NO. : 8,541,689 B2  Page 1 of 1
APPLICATION NO. : 12/449611
DATED : September 24, 2013
INVENTOR(S) : Gerald Weidinger It is certified that error appears in the above-identified patent and that said Letters Patent is hereby corrected as shown below:

On the Title Page

Please correct the Assignee name as listed below

(73)   Assignee:   AT & S Austria Technologie & Systemtechnik Aktiengesellschaft,
Leoben-Hinterberg (AT)

Signed and Sealed this
Third Day of December, 2013

Margaret A. Focarino
*Commissioner for Patents of the United States Patent and Trademark Office*

UNITED STATES PATENT AND TRADEMARK OFFICE
CERTIFICATE OF CORRECTION

PATENT NO. : 8,541,689 B2
APPLICATION NO. : 12/449611
DATED : September 24, 2013
INVENTOR(S) : Weidinger et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 911 days.

Signed and Sealed this
Fifteenth Day of September, 2015

Michelle K. Lee
*Director of the United States Patent and Trademark Office*